United States Patent
Ma et al.

(10) Patent No.: US 9,231,550 B2
(45) Date of Patent: Jan. 5, 2016

(54) OUTPUT MATCHING NETWORK FOR WIDEBAND POWER AMPLIFIER WITH HARMONIC SUPPRESSION

(71) Applicant: Mitsubishi Electric Research Laboratories, Inc., Cambridge, MA (US)

(72) Inventors: Rui Ma, Somerville, MA (US); SungWon Chung, Brookline, MA (US); Koon Hoo Teo, Lexington, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 14/299,128

(22) Filed: Jun. 9, 2014

(65) Prior Publication Data

US 2015/0357989 A1    Dec. 10, 2015

(51) Int. Cl.
*H04M 1/00*    (2006.01)
*H03H 7/38*    (2006.01)
*H03H 7/01*    (2006.01)
*H04M 1/02*    (2006.01)

(52) U.S. Cl.
CPC ............... *H03H 7/38* (2013.01); *H03H 7/0115* (2013.01); *H04M 1/026* (2013.01); *H03H 2007/013* (2013.01)

(58) Field of Classification Search
None
See application file for complete search history.

(56) References Cited

U.S. PATENT DOCUMENTS

| | | | |
|---|---|---|---|
| 3,271,705 A | 9/1966 | Karkar et al. | |
| 6,216,012 B1 | 4/2001 | Jensen | |
| 6,331,815 B1 * | 12/2001 | Oshima | H03H 7/38 326/30 |
| 6,470,173 B1 | 10/2002 | Okada et al. | |
| 6,621,376 B2 * | 9/2003 | Liu | H03F 1/56 333/126 |
| 6,970,040 B1 | 11/2005 | Denning | |
| 7,005,940 B2 | 2/2006 | Kodim | |
| 7,593,703 B2 | 9/2009 | Wiegner et al. | |
| 7,676,244 B2 | 3/2010 | Park et al. | |
| 8,207,798 B1 | 6/2012 | Wright | |
| 8,368,483 B2 | 2/2013 | Fukuda et al. | |
| 8,428,646 B2 | 4/2013 | Rofougaran | |
| 8,461,931 B1 | 6/2013 | Bayruns et al. | |
| 2003/0083034 A1 | 5/2003 | Motoyama et al. | |
| 2003/0117219 A1 | 6/2003 | Yamamoto et al. | |
| 2008/0079513 A1 | 4/2008 | Prikhodko et al. | |
| 2010/0291888 A1 | 11/2010 | Hadjichristos et al. | |
| 2011/0165849 A1 * | 7/2011 | Gorbachov | H04B 1/48 455/84 |
| 2011/0234316 A1 | 9/2011 | Kim et al. | |
| 2013/0178168 A1 | 7/2013 | Duan et al. | |
| 2013/0187712 A1 | 7/2013 | Cabanillas et al. | |
| 2013/0324058 A1 * | 12/2013 | Yoon | H04B 5/0062 455/83 |
| 2014/0055210 A1 | 2/2014 | Black et al. | |
| 2014/0354356 A1 * | 12/2014 | Beltran | H03F 3/2176 330/251 |

FOREIGN PATENT DOCUMENTS

WO     9901931 A1    1/1999

OTHER PUBLICATIONS

Robert A. Pease, Analog Circuits World Class Designs, 2008, pp. 250-251.*

* cited by examiner

*Primary Examiner* — Edward Urban
*Assistant Examiner* — Mohammed Rachedine
(74) *Attorney, Agent, or Firm* — Dirk Brinkman; Gene Vinokur

(57) ABSTRACT

A wideband harmonic trap includes a first resonant tank in the form of a parallel LC circuit, and a second resonant tank in the form of a series LC circuit. The LC circuits are connected to a common input, an output of the parallel LC circuit is connected to a load and to ground via a shunt capacitor, and an output of the series LC circuit is connected to the ground.

7 Claims, 10 Drawing Sheets

OUTPUT MATCHING NETWORK FOR WIDEBAND POWER AMPLIFIER WITH HARMONIC SUPPRESSION

FIELD OF THE INVENTION

The invention relates generally to radio frequency (RF) power amplifiers, and more particular to an output matching network in a wideband multi-mode multi-band amplifier module.

BACKGROUND OF THE INVENTION

Recently, the need for very wideband RF power amplifiers has significantly increased due to new wireless communication technologies, particular in transceivers used in mobile application. Therefore, there is a need for a single multi-mode multi-band power amplifier module, which can support communication technologies such as Wideband Code Division Multiple Access (WCDMA), Global System for Mobile (GSM), Communications, Enhanced Data Rates for GSM Evolution (EDGE), and Long Term Evolution (LTE) technologies. However, obtaining a high-performance wideband RF power amplifier for multi-mode multi-band radio is difficult, particularly the harmonic suppression.

The harmonic suppression is one important performance criterion in ensuring multi-user communication by limiting the emission of nonlinear harmonics that arise from the nonlinearity of RF power amplifiers, mainly due to the distortion.

Second-order harmonics are the most important to suppress for wideband RF power amplifiers because of the closest frequency space to the operation frequency band, and the strong power among all of the harmonic tones. For example, when the bandwidth of a power amplifier covers from 1.5 GHz to 2.7 GHz, the lowest second-order harmonic is at 3 GHz, introducing a difficult design issue on the output matching network (OMN). The highest in-band channel at 2.7 GHz should have a low insertion loss, while the lowest second-order harmonic at 3 GHz should have a high suppression from the output matching network. This demands output matching network design for providing sufficient second-order harmonic suppression, normally better than 30 decibels relative to the carrier (dBc), while not affecting the in-band operation.

FIG. 2 shows a prior art of a multi-band power amplifier that fulfills the necessary second harmonic suppression requirement through multi-chain topology. Two power amplifiers 201 and 203 are designed independently to provide second order harmonic suppression in narrow band A and band B. Compared to a single wide band power amplifier, this multi-chain architecture requires a switch 205 connected with the output matching networks 202 and 204. The output matching network (OMN) 202 and 204 are designed such that the second order harmonic suppression at each narrow band A and B is achieved. The design requirements of OMN 202 and 204 for multi-chain architecture are less challenging than a single OMN for a wideband power amplifier, but the overall circuit is more complex and large profile.

FIG. 3 shows another prior art multiband power amplifier, which achieves the second harmonic suppression using a reconfigurable output matching networks. A multi band power amplifier 302 with an input matching network (IMN) 301 and an output matching network (OMN) 303 provides impedance matching and harmonic rejection for band A, when switch 304 is OFF. When the power amplifier 302 operates for band B, OMN 305 is combined with the 303 with switch 304 ON, so that that impedance matching and second harmonic suppression for band B is achieved. The disadvantage of this reconfigurable output matching network is switch 304. Although the switch enables a reconfigurable output matching optimized for each single band, the insertion loss from the switch can significantly reduce the power efficiency of the overall multi-mode power amplifier with additional cost and complexity.

FIG. 4 shows another prior art multiband power amplifier, which achieves the second harmonic suppression with multiple band suppression filters in the output matching network of a power amplifier. A filter 401 includes one wideband low-pass filter and four band-suppression filters (410, 420, 430 and 440). Each band-suppression filter is a series LC tank. The bandwidth of each band-suppression filter at stop band is determined by the Q of the tank. For a low insertion loss, the tank Q should be higher, which in turn reduces the stop-band bandwidth.

The required suppression band for second harmonic is 2×(fH−fL), which is two times wider than the pass-band bandwidth (fH−fL). Hence, for wideband multi-mode operation, a single band-elimination filter cannot provide the stop-band bandwidth over 2×(fH−fL). Instead, several band-elimination filters resonating at different frequencies are necessary to provide a wide stop-band bandwidth, which results in a large insertion loss from the additional passive elements in the output matching network and large profile.

In a summary, the power efficiency degradation and the increased cost and area requirement for the multiple band-elimination filters are the primary disadvantages of prior art wideband multi-mode power amplifiers.

SUMMARY OF THE INVENTION

The embodiments of the invention provide an output matching network for a wideband power amplifier with harmonic suppression. In particular, the matching network improves the suppression of second harmonics using a wideband harmonic trap that can be combined with a wideband output matching network for a wideband power amplifier. The harmonic trap is based on a band-stop filter that uses a relatively small number of elements, when compared with the prior art, to achieve a given stop-band attenuation and stop-band bandwidth for wideband power amplifiers.

Because only a small number of additional elements are necessary to implement the harmonic trap, one important feature of the invention is that a low-cost and high performance implementation of multi-band operation of the wideband power amplifier is enabled, compared to the prior art, in multi-chain architectures and multiple band-elimination filters.

The embodiments do not require a switch, and the degradation of the power amplifier efficiency can be much smaller than the prior art based on reconfigurable matching networks. Having a switch in the output match network of a power amplifier presents design difficulties, because of the high power handling capability and insertion loss of the switch. In addition to the efficiency loss problem, control circuitry for the switches increases design complexities and costs.

DETAILED DESCRIPTION OF THE DRAWINGS

DETAILED DESCRIPTION OF THE PREFERRED EMBODIMENTS

Figure 1:
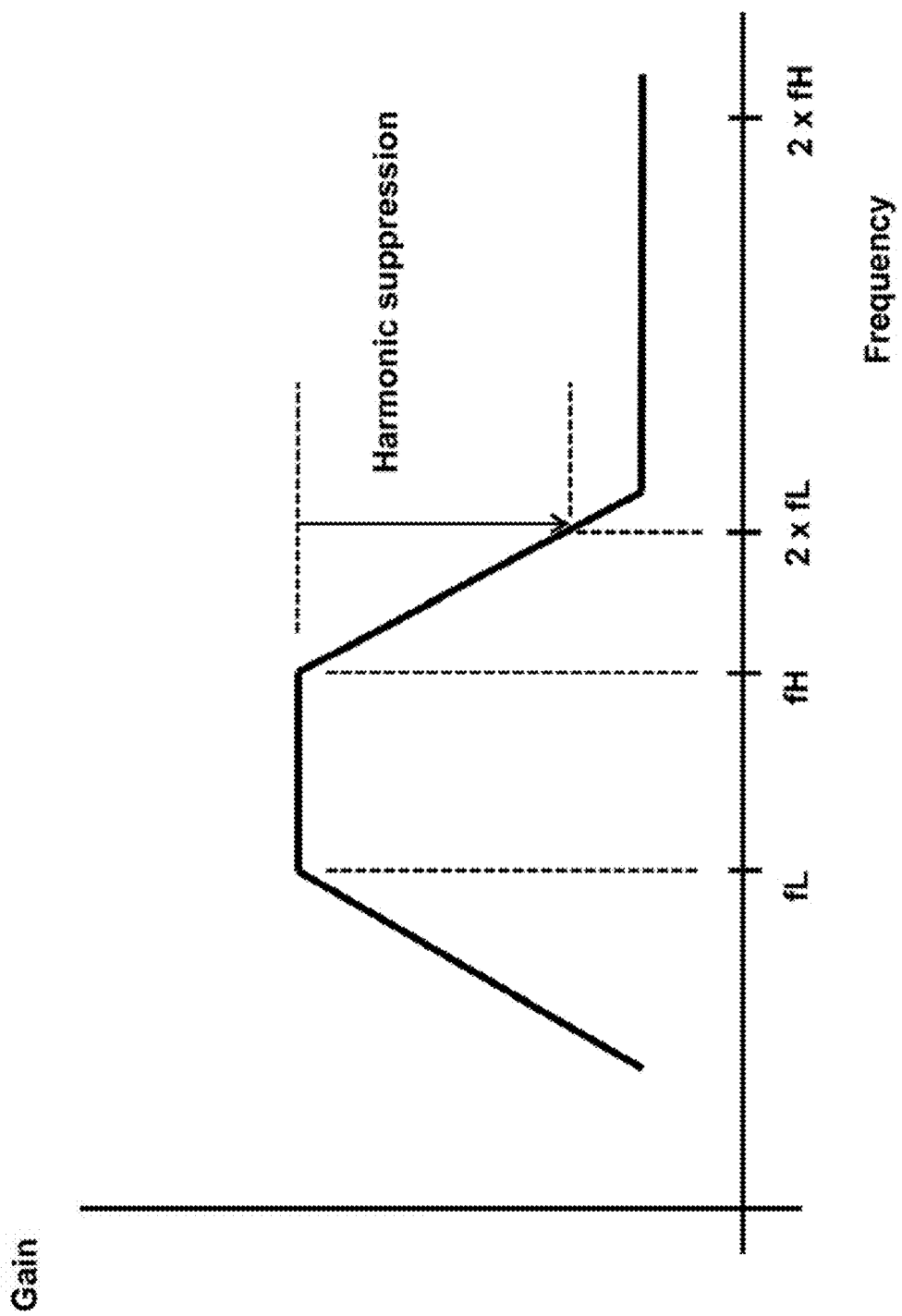
FIG. 1 is a graph of gain as a function of frequency of wideband power amplifiers regarding the second harmonic suppression required by embodiments of the invention.
Figure 2:
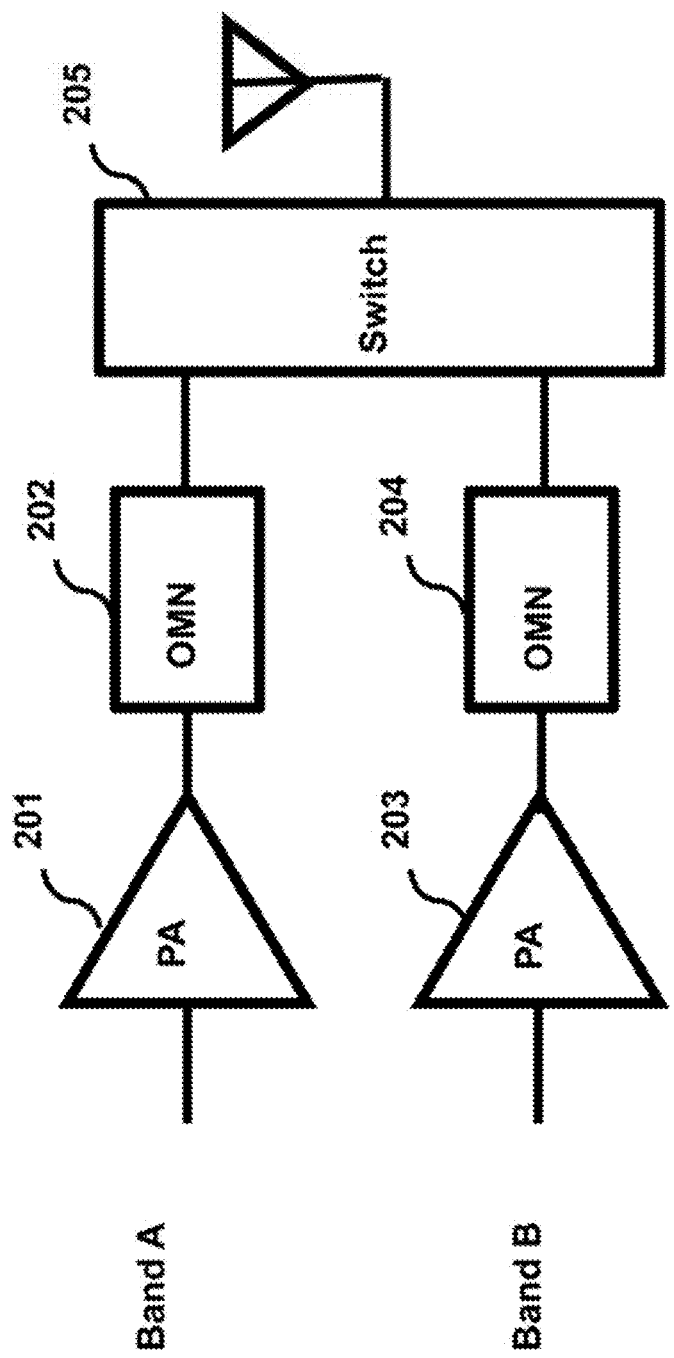
FIG. 2 is a block diagram of a prior art multi-band power amplifier based on a multi-chain architecture.
Figure 3:
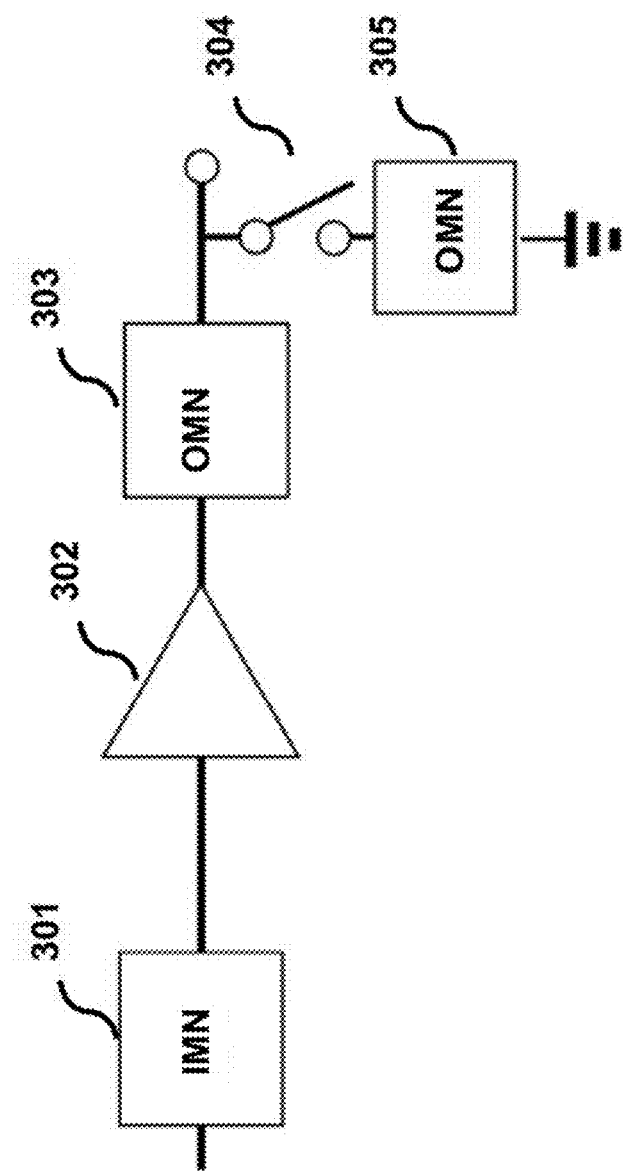
FIG. 3 is a block diagram of a prior art multi-band power amplifier based on a reconfigurable output matching network using switch.
Figure 4:
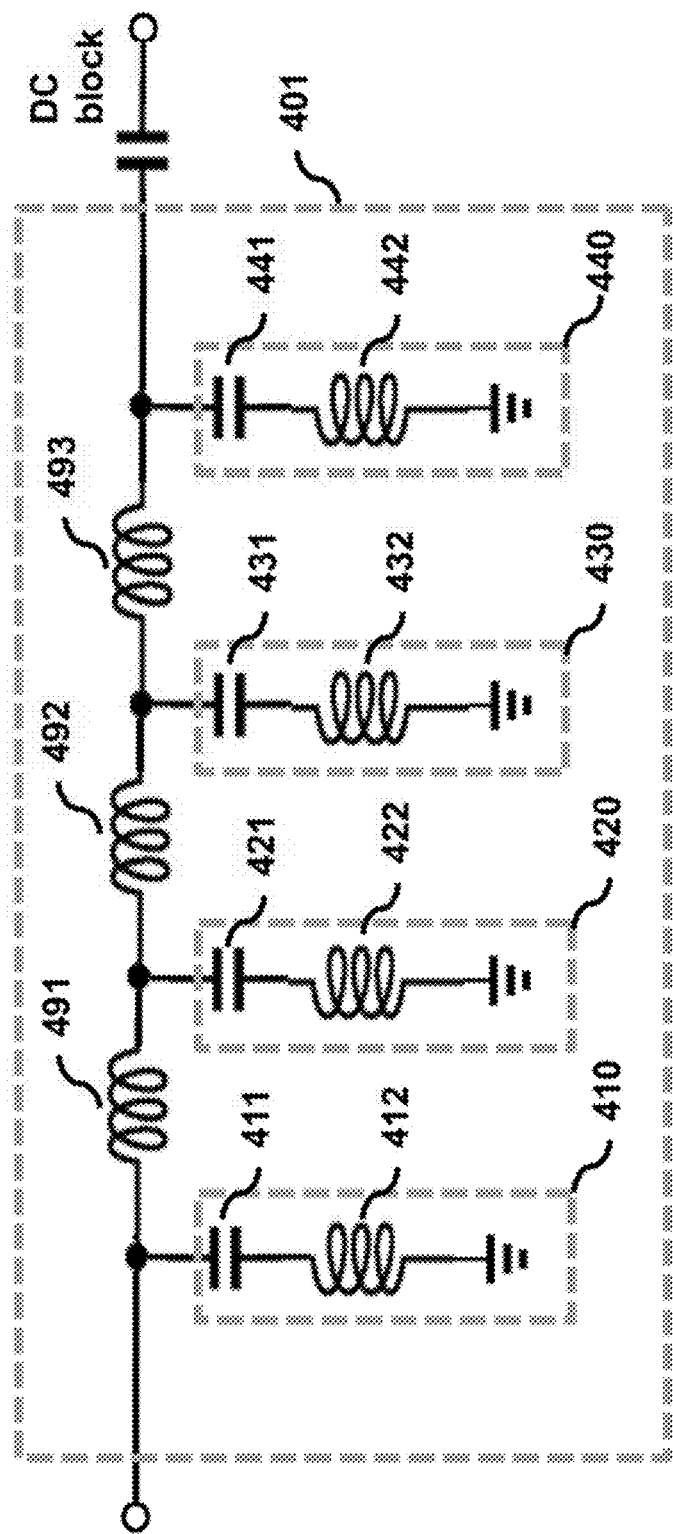
FIG. 4 is a schematic of a prior art wideband output matching network with multiple narrowband harmonic filters for wideband power amplifiers.

The embodiments of the invention provide an output matching network for a wideband power amplifier with harmonic suppression. Of particular interest are power amplifiers in transceivers used in mobile application, e.g., cellular telephony FIG. 1 shows a typical requirement on the power gain of wideband power amplifiers regarding second harmonic suppression. The lowest in-band frequency (fL) is related to the lowest second-harmonic frequency (2×fL), which is two times higher than the lowest in-band frequency. For a multi-mode multi-band power amplifier module that covers a wide frequency range, the highest in-band frequency (fH) is normally quite close to the lowest second-harmonic frequency (2×fL) for modern handset phone. Therefore, the design of the output matching network with the power amplifier is very challenging for providing suppression better than 30 dBc.

Figure 5:
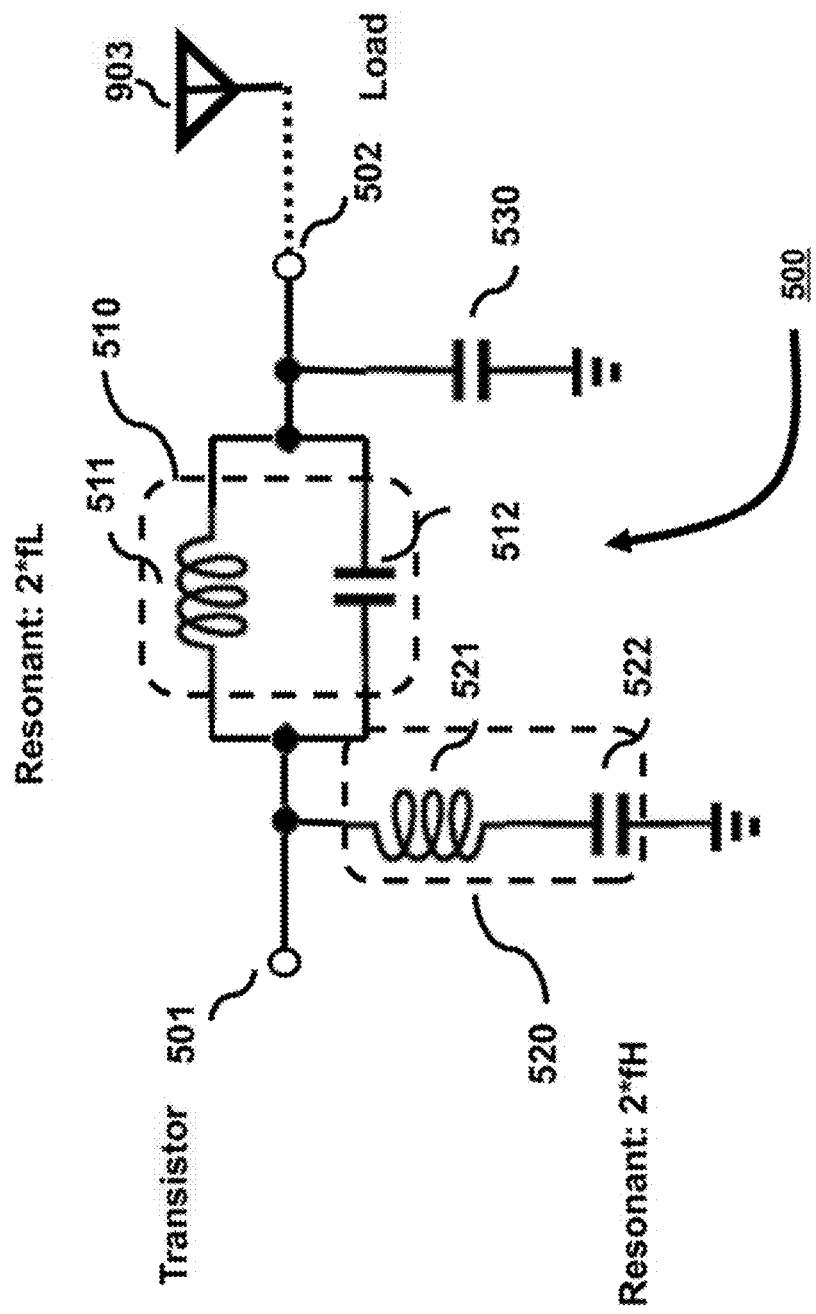
FIG. 5 is a schematic of a wideband harmonic trap according to one embodiment of the invention.

FIG. 5 shows a wideband harmonic trap 500 according to one embodiment of the invention. The trap is optimized from a sixth-order band-stop filter for output matching and harmonic suppression purposes.

The wideband harmonic trap includes a shunt capacitor 530 and first resonant tanks 510 and a second resonant tank 520. The first tank 510 includes a parallel L (511) C (512) circuit, and the second tank 520 includes a series L (521) C (522) circuit. The parallel and series LC circuits are connected to a common input, e.g., a transistor 501. An output of the parallel LC circuit is connected to a load and to ground via the shunt capacitor. The load can include an antenna. And output of the parallel LC 520 circuit is connected to the ground via a capacitor 530.

Conventional sixth-order band-stop filter have an additional series LC tank instead of the single capacitor 530. The conventional sixth-order band-stop filter has a disadvantage for wideband power amplifier output matching application and should be modified and optimized. The attenuation at pass-bands is relatively low for conventional band stop filters. However, for wideband power amplifiers operation, it is desired to have the large attenuation in the high-frequency pass-band for higher order harmonics suppression.

Another important issue is related with the Q factor of the resonant tank 510 and 520. Theoretically, a lower Q factor of resonant circuit offers a broader bandwidth. The Q factor is proportional to the value of inductor 521 in series tank 520, and inversely proportional to the value of the inductor 511 in the parallel tank 510. Assuming that the lowest and highest pass-band edge of a multi-band power amplifier are fl and fH as shown in FIG. 1, the resonant frequencies of the two tanks 510 and 520 are approximately at 2×fL and 2×fH. This is arranged considering the inductor loss is normally the dominating loss mechanism in high frequency circuit implementation, and loss of inductors increase with frequency. The final optimum values of these inductors and capacitors need to be determined considering the parasitic and packaging effects, which are often different from theoretical values.

Figure 6:
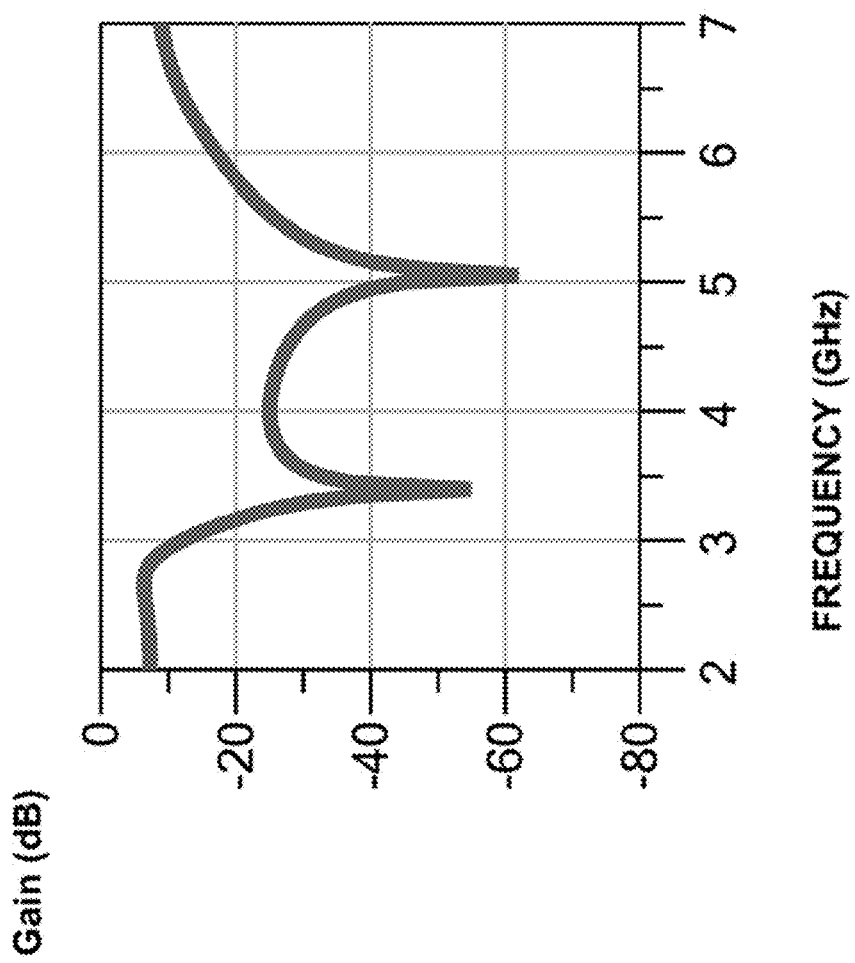
FIG. 6 is a graph of a frequency response as a function of gain of the wideband harmonic trap of FIG. 5.

FIG. 6 shows an exemplary frequency response, as a function of gain vs. frequency, of a wideband harmonic trap according to the invention. By making the resonant frequency of the parallel LC tank 510 lower than that of the series LC tank 520, the stop-band of the harmonic trap can be wide. Shunt capacitor 530 introduces desirable characteristics in the frequency response that the high-frequency pass-band has a larger attenuation than the low-frequency pass-band for improving harmonic suppression at even higher frequencies.

Figure 7:
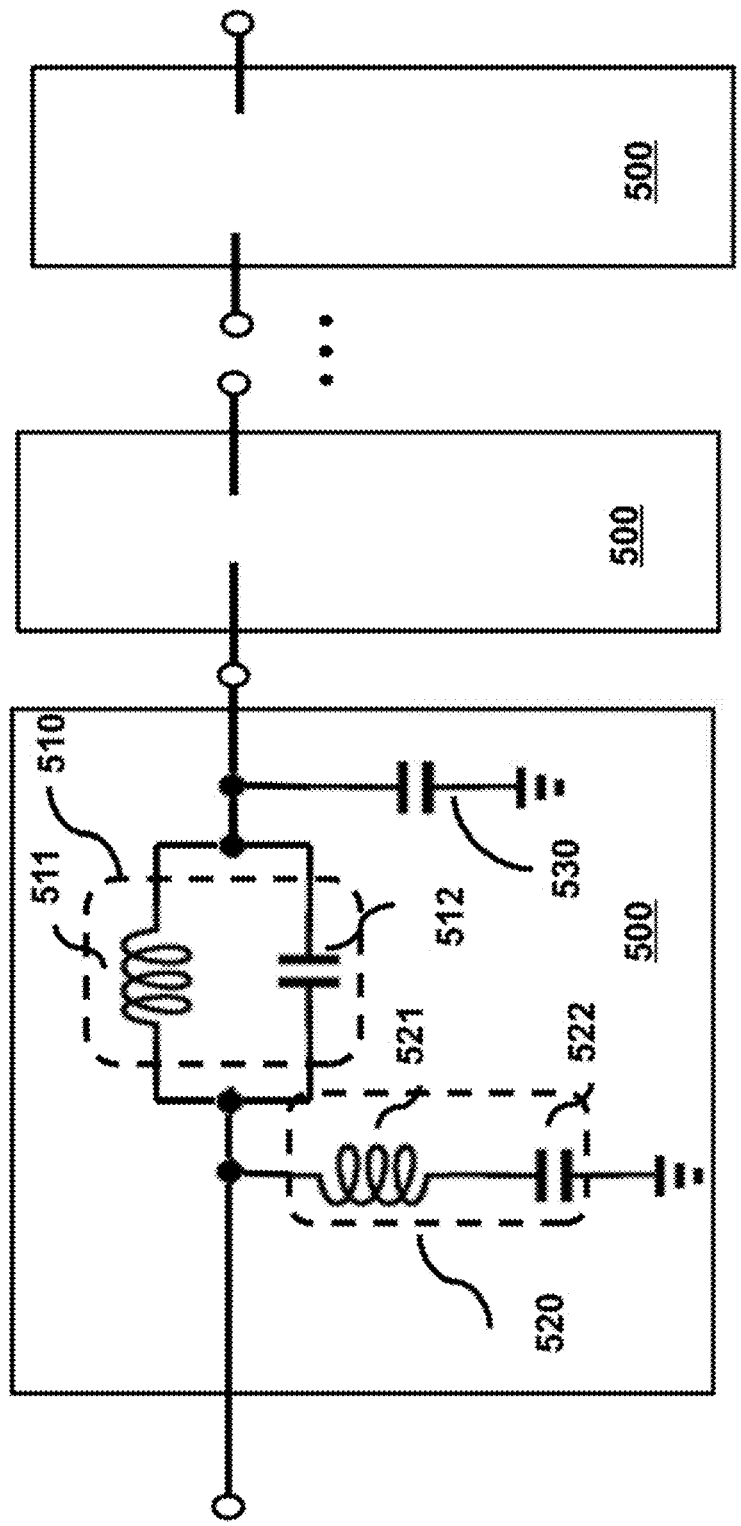
FIG. 7 is a schematic of a wideband harmonic trap according to one embodiment of the invention.

FIG. 7 shows another embodiment of the invention. Connecting the multiple traps 500 in series can increase the effective order of the filters, which provide better suppression on the stop band, though with increased complexity and profile.

Figure 8:
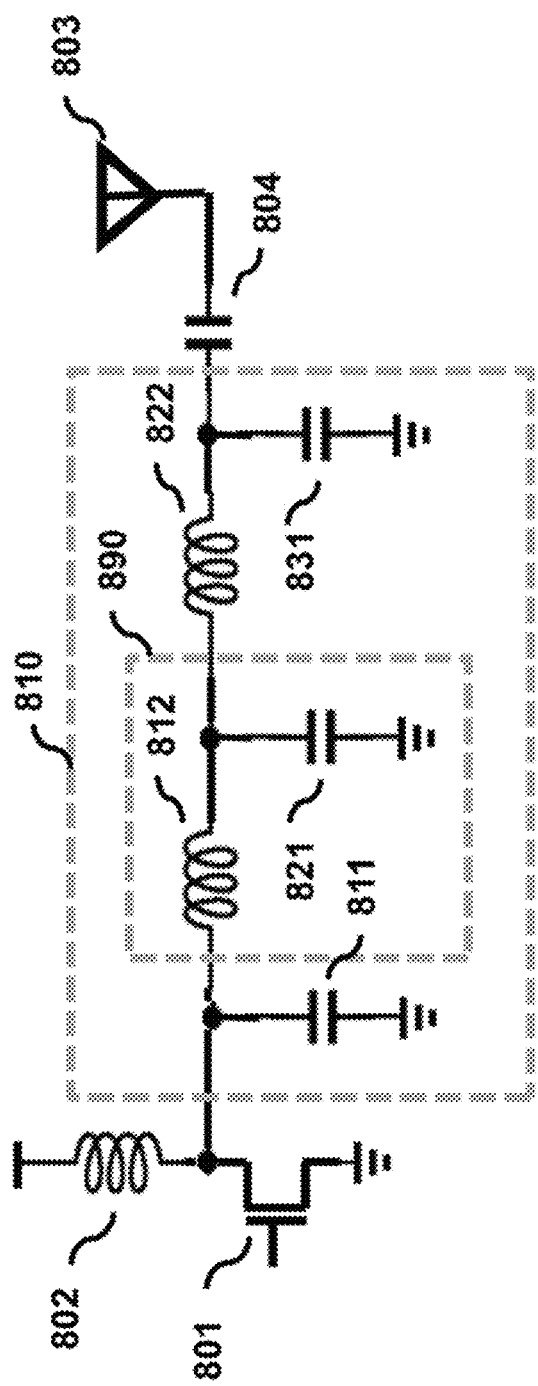
FIG. 8 is a schematic of a wideband power amplifier with a conventional wideband output matching network.

FIG. 8 shows a wideband power amplifier with a conventional wideband low pass output matching network. The multi-band power amplifier includes of a power transistor 801, a choke inductor 802, a DC block capacitor 804, terminating at an antenna 803. The output matching network 810 transforms the system impedance, normally 50 Ohm, to an optimum impedance of the transistor output over the whole operation bandwidth by using several multi-section LC ladders 890.

The main design challenge with this multi-band power amplifier is that communication standard requirements on the second harmonic rejection for the lowest band is very difficult to meet, particularly when the highest pass-band of the multi-band power amplifier is close to the second harmonic frequency of the lowest pass-band.

If the wideband matching network is designed to meet the second harmonic rejection requirement, then the Q value of the filter becomes very high, resulting in a large number of passive elements and incurring a large insertion loss. For this reason, although the wideband impedance matching network 810 provides low-pass filtering frequency response, the second harmonic rejection is normally insufficient for very wideband multi-band power amplifiers.

Figure 9:
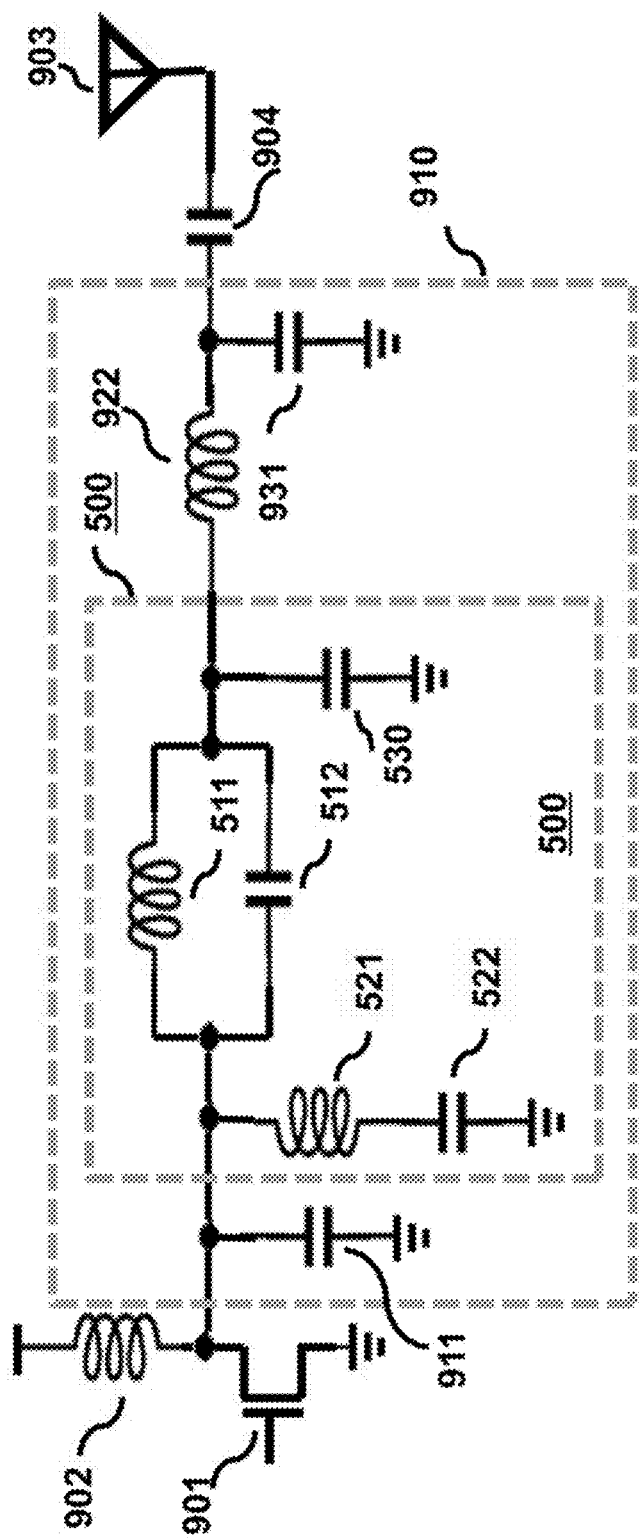
FIG. 9 is a schematic of a wideband harmonic trap according for a wideband power amplifier according to one embodiment of the invention.

FIG. 9 shows one embodiment of the wideband harmonic trap according to embodiments of the invention for a multi-band power amplifier, which solves the second harmonic suppression problem using a compact and low-cost implementation that enables high power efficiency. The multi-band power amplifier includes a power transistor 901, a choke inductor 902, a DC block capacitor 904, and is terminated at an antenna 903. The output matching network 910 including a shunt impedance matching capacitor 911 transforms the impedance of the wideband harmonic trap, normally 50 ohm, to an optimum load impedance of the power transistor 901 over an entire operation frequency range (fL~fH).

The harmonic trap 500 is embedded within the output matching network 910 for harmonic suppression over 2fL~2fH. The inductor 511 and the capacitor 530 are used for both the wideband impedance transformation within operation bands and the harmonic suppression, so that the number of elements to implement the output matching network is reduced. Although the design of the resonant tanks 510 and 520 are described above, their values are determined based on the performance requirements, such as power efficiency, output power, gain flatness, and linearity. The output of the trap 500 is connected to the antenna via an inductor 922 and a capacitor 904. A capacitor 931 connects the output of the inductor 922 to ground.

Figure 10:
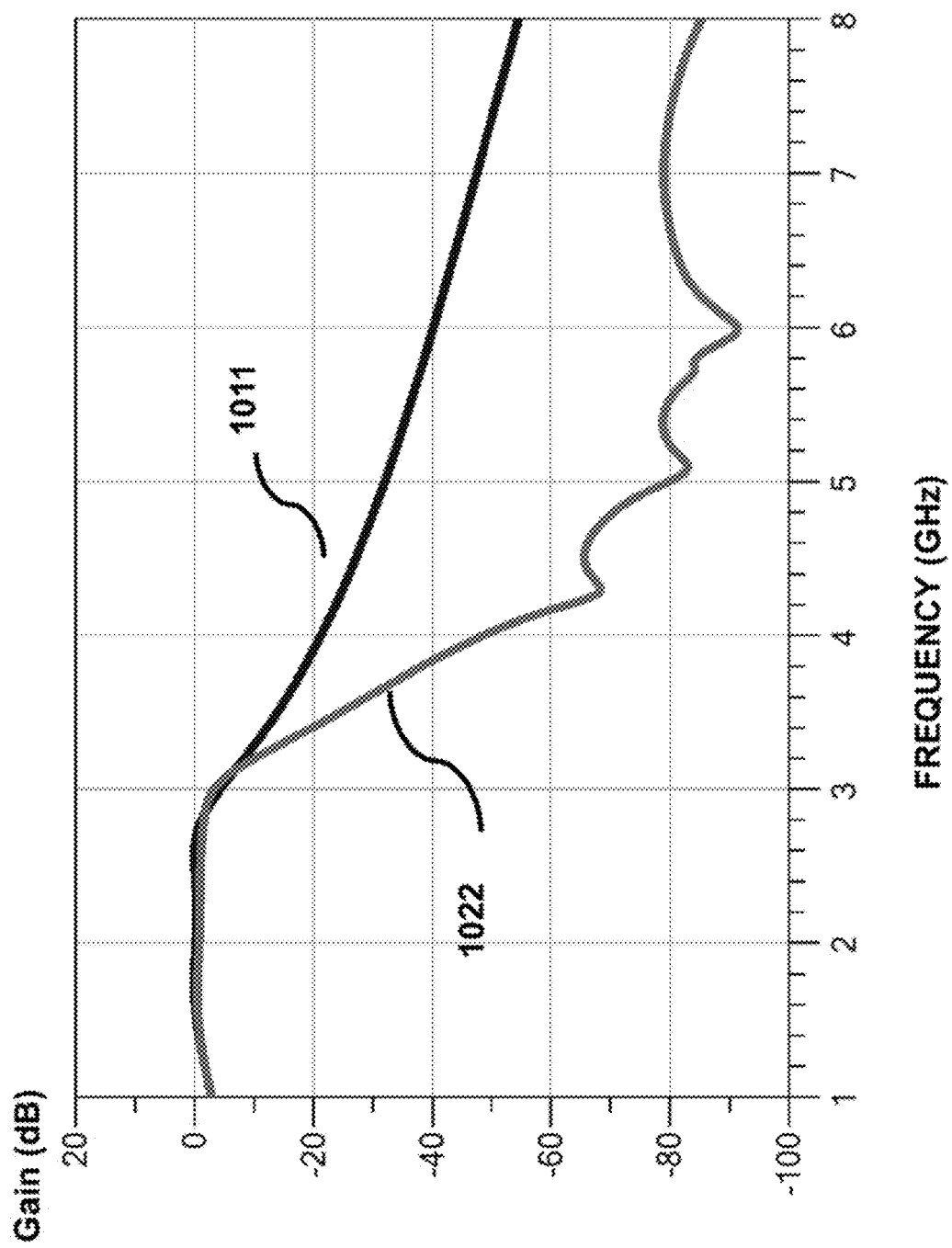
FIG. 10 is a graph of a frequency response as a function of gain of the output matching network with and without the wideband harmonic trap.

FIG. 10 shows the frequency response of the output matching network with (1022) and without (1011) the wideband harmonic traps of this invention. For a wideband matching network designed for power amplifier operation from e.g., 1.8~2.8 GHz, for the lowest operation frequency of 1.8 GHz, 10-15 dB improvement in the second-order harmonic rejection at 3.6 GHz is expected by introducing the harmonic trap of the invention to the wideband output matching network.

The embodiment of the harmonic trap is not limited to the specific output matching circuit described with FIGS. 5 and 7. The harmonic trap can be combined with an output matching circuit, which lacks sufficient second harmonic rejection. For example, a transmission line can be used in a distributed form to represent the lumped inductors and capacitors equivalently in the matching network implementation.

Although the invention has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

We claim:

1. An apparatus, comprising:
 a first resonant tank comprising:
  a parallel LC circuit, wherein L represents an inductor and C represents a capacitor;
 a second resonant tank, comprising:
  a series LC circuit;
 a shunt capacitor, wherein the parallel and series LC circuits are connected to a common input, an output of the parallel LC circuit is connected to a load and to ground via the shunt capacitor, and an output of the series LC circuit is connected to the ground to form a wideband harmonic trap optimized from a sixth-order band-stop filter and provides a highest attenuation in a high-frequency pass-band compared to both fourth-order and sixth-order band-stop filters topology.

2. The apparatus of claim 1, wherein the wideband harmonic trap is combined with a wideband output matching network for a wideband power amplifier.

3. The apparatus of claim 1, wherein the common input is a transistor.

4. The apparatus of claim 1, wherein the apparatus is used in a mobile transceiver for cellular telephony.

5. The apparatus of claim 1, wherein multiple wideband harmonic traps are connected in series.

6. The apparatus of claim 1, wherein the load includes an antenna.

7. The apparatus of claim 3, further comprising:
 a second shunt impedance matching capacitor, connected between the parallel and series LC circuits, to transforms an impedance, normally 50 ohm, of the wideband harmonic trap, to an optimum load impedance of the transistor over an entire operation frequency range.

* * * * *